United States Patent
Tong et al.

(10) Patent No.: US 8,693,197 B2
(45) Date of Patent: Apr. 8, 2014

(54) HEAT SINK DEVICE

(75) Inventors: Ai-Xing Tong, Shanghai (CN); Yu-Ming Chang, Shanghai (CN); Hong-Jian Gan, Shanghai (CN); Shao-Cai Ma, Shanghai (CN); Jian-Ping Ying, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 173 days.

(21) Appl. No.: 13/342,112

(22) Filed: Jan. 2, 2012

(65) Prior Publication Data

US 2013/0107458 A1 May 2, 2013

(30) Foreign Application Priority Data

Oct. 26, 2011 (CN) .......................... 2011 1 0330134

(51) Int. Cl.
*H05K 7/20* (2006.01)

(52) U.S. Cl.
USPC ........... 361/700; 361/703; 361/719; 361/720; 363/37; 363/141

(58) Field of Classification Search
USPC ........ 361/679.52, 700, 719–721; 363/37, 141
See application file for complete search history.

(56) References Cited

U.S. PATENT DOCUMENTS

| | | | | |
|---|---|---|---|---|
| 5,793,611 | A * | 8/1998 | Nakazato et al. | 361/704 |
| 5,986,909 | A * | 11/1999 | Hammond et al. | 363/65 |
| 6,055,157 | A * | 4/2000 | Bartilson | 361/699 |
| 6,062,299 | A * | 5/2000 | Choo et al. | 165/46 |
| 6,229,722 | B1 * | 5/2001 | Ichikawa et al. | 363/71 |
| 6,788,537 | B2 * | 9/2004 | Saita et al. | 361/700 |
| 7,119,284 | B2 * | 10/2006 | Bel et al. | 174/252 |
| 8,004,842 | B2 * | 8/2011 | Huang et al. | 361/700 |
| 2013/0083485 | A1 * | 4/2013 | Tong et al. | 361/700 |
| 2013/0100716 | A1 * | 4/2013 | Tong et al. | 363/37 |
| 2013/0121042 | A1 * | 5/2013 | Gan et al. | 363/37 |

* cited by examiner

*Primary Examiner* — Robert J Hoffberg
(74) *Attorney, Agent, or Firm* — CKC & Partners Co., Ltd.

(57) ABSTRACT

The present invention provides a heat sink device, suitable to the heat dissipation of a high-power medium-voltage drive power cell. The device comprises a heat dissipation substrate having a first surface, a second surface and an inner layer between the first surface and the second surface; a heat pipe having an evaporation section and a condensation section. The evaporation section is buried in the inner layer of the heat dissipation substrate, and the condensation section is used to dissipate the heat from the evaporation section to the air. The power elements of the high-power medium-voltage drive power cell are disposed on the first surface and the second surface, respectively.

12 Claims, 2 Drawing Sheets

HEAT SINK DEVICE

RELATED APPLICATIONS

This application claims priority to Chinese Application Serial Number 201110330134.6, filed Oct. 26, 2011, which is herein incorporated by reference.

BACKGROUND

1. Field of Invention

The present invention relates to a high-power medium-voltage drive in electrical and electronic fields. More particularly, the present invention relates to a heat sink device suitable for use in a high-power medium-voltage drive power cell.

2. Description of Related Art

With the rapid development of modern electrical and electronic technology and microelectronic technologies, a high-voltage medium-power drive apparatus has increasingly wide applications, such as wind turbines, water pumps, compressors, rolling mills or the like in petrochemical, municipal water supply, die casting, power energy source industries.

There are vast categories for the high-power medium-voltage drive and there also are a variety of sorting methods related thereto. For example, the high-power medium-voltage drive may be classified as an AC-AC drive or an AC-DC-AC drive based on whether a DC current appears in a middle stage; as a current-type drive or a voltage-type drive based on the property of the DC portion; as a high-high drive or a high-low-high drive based on whether a low-voltage loop exists; and as a 2-level drive, a 3-level drive, a 5-level drive or a multi-level drive based on the number of the levels outputted by the drive. No matter what classifying manner is adopted, the power module with an independent function is one of the most important parts of the medium-voltage drive and is also the crucial part for implementing the medium-voltage variable frequency speed control. During the normal operation, the temperature of the power elements in the module continuously increases, so the heat dissipation design is an indispensable step in comprehensive consideration of the design specification in every aspect.

Currently, most of the heat dissipation designs for the high-power medium-voltage drive mostly adopt an aluminum extrusion heat sink. All portions of the power elements are placed on the heat sink. This structure causes high heat dissipation requirements. When a large heat sink, the distance between the power modules is relatively large and the layout is non-compact, which further causes inconvenience for the electrical connections and matching between the power elements and electrolytic capacitor assemblies. Moreover, the aluminum extrusion heat sink has a large volume, a heavy weight and a high cost, so that the aluminum extrusion heat sink is disadvantageous to the saving of system installation cost.

In view of the above, those in the industry are endeavoring to find ways to design a heat sink device suitable for use in a high-power medium-voltage drive power cell for effectively dissipating heat and meanwhile enabling the overall drive structure to be more compact.

SUMMARY

To solve the deficiencies in the application of the heat sink device of the high-power medium-voltage drive power cell in the prior art, this disclosure provides a novel heat sink device.

This disclosure provides a heat sink device, suitable for performing heat dissipation on a high-power medium-voltage drive power cell. The heat sink device includes a heat dissipation substrate and a heat pipe. The heat dissipation substrate has a first surface, a second surface and an inner layer between the first surface and the second surface. The heat pipe has an evaporation section and a condensation section. The evaporation section of the heat pipe is buried in the inner layer of the heat dissipation substrate, and the condensation section of the heat pipe is used to dissipate heat from the evaporation section to air. Some a portion of elements of the high-power medium-voltage drive power cell are disposed on the first surface of the heat dissipation substrate, and the other portion of the power elements of the high-power medium-voltage drive power cell are disposed on the second surface of the heat dissipation substrate.

In an embodiment, the high-power medium-voltage drive power cell includes an inverter circuit, a rectifier circuit and a bypass circuit. The inverter circuit is disposed on the first surface of the heat dissipation substrate, and the rectifier circuit and the bypass circuit are disposed on the second surface of the heat dissipation substrate. The inverter circuit is an H-inverter bridge including a plurality of bridge arms. Each bridge arm has plural IGBTs (Insulated Gate Bipolar Transistors), and the IGBTs in an upper arm and a lower arm of each bridge arm are connected in parallel. The rectifier circuit is a rectifier bridge, and each bridge arm has at least one rectifier diode. The bypass circuit includes plural bridge arms and a switching branch connected in parallel to each of the bridge arms. Each bridge arm has plural diodes connected in series, connected in parallel or a combination of series and parallel, and the switching branch has a thyristor.

In another embodiment, the heat sink device further includes plural heat sink fins disposed perpendicularly to the heat pipe and securely connected to the condensation section of the heat pipe, so as to dissipate the heat from the condensation section to the air.

The heat dissipation substrate is made of copper, aluminum or an aluminum alloy.

In a specific embodiment, the condensation section of the heat pipe is set to have different lengths according to generated heat and heat dissipation requirements of the power elements.

In another specific embodiment, the evaporation section of the heat pipe is set to have different diameters according to heat dissipation requirements of the power elements. The evaporation section of the heat pipe is a circular pipe structure or a rectangular pipe structure.

In still another embodiment, the heat pipe is a gravity heat pipe, a groove heat pipe, a sintered heat pipe or a screen heat pipe.

In the application of the heat sink device of this disclosure, the evaporation section of the heat pipe is buried in the inner layer of the heat dissipation substrate, and a portion of the power elements and the other portion of the power elements of the high-power medium-voltage drive power cell are respectively disposed on two side surfaces of the heat dissipation substrate, thereby significantly reducing working temperatures of the power elements due to an excellent thermal conductivity of the heat pipe. Moreover, the power elements of the drive are disposed on two side surfaces of the heat dissipation substrate respectively, thereby effectively reducing the layout space of the power elements and further reducing the volume of the heat dissipation substrate.

BRIEF DESCRIPTION OF THE DRAWINGS

The present invention can be more fully understood by reading the following detailed description of the embodiment, with reference made to the accompanying drawings as follows.

DETAILED DESCRIPTION

Figure 1:
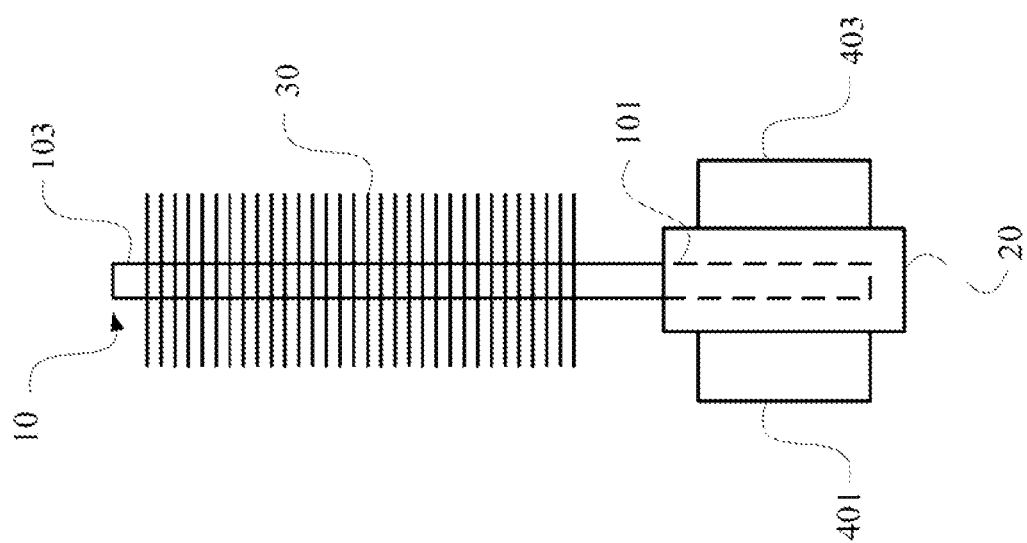
FIG. 1 is a schematic structural view of a heat sink device applicable to a high-power medium-voltage drive power cell according to an aspect of the present invention.

Specific embodiments of the present invention are further described in detail below with reference to the accompanying drawings.

In order to make the description of the present invention more detailed and more comprehensive, various embodiments are described below with reference to the accompanying drawings. The same reference numbers are used in the drawings to refer to the same or like elements. However, the embodiments described are not intended to limit the present invention. Moreover, it is not intended for the description of operation to limit the order of implementation. Any device with equivalent functions that is produced from a structure formed by a recombination of elements shall fall within the scope of the present invention.

The drawings are only illustrative and are not drawn to actual size. Additionally, well-known elements and steps are not described in the embodiments to avoid causing unnecessary limitations to the present invention.

FIG. 1 is a schematic structural view of a heat sink device for a high-power medium-voltage drive power cell according to an aspect of the present invention. Referring FIG. 1, the heat sink device includes a heat pipe 10 and a heat dissipation substrate 20.

More specifically, the heat pipe 10 has an evaporation section 101 and a condensation section 103. The evaporation section 101 is buried in an inner layer of the heat dissipation substrate 20, and the condensation section 103 is used to transfer heat from the evaporation section 101 to heat sink fins on the heat sink device and then dissipate the heat to air.

The heat dissipation substrate 20 has a first surface (e.g. the left surface of the heat dissipation substrate 20), a second surface (e.g. the right surface of the heat dissipation substrate 20) and the inner layer between the first surface and the second surface. A portion of power elements 401 of the high-power medium-voltage drive power cell are disposed on the first surface of the heat dissipation substrate 20, and the other portion of the power elements 403 of the high-power medium-voltage drive power cell are disposed on the second surface of the heat dissipation substrate 20. It can be known from FIG. 1 that the power elements are respectively disposed on two sides of the heat dissipation substrate 20. With the excellent thermal conductivity of the heat pipe 10 buried in the inner layer of the substrate 20, the working temperatures of the power elements in normal operation may be kept low.

Those skilled in the art should understand that the power elements 401 and 403 respectively disposed on two sides of the heat dissipation substrate 20 in FIG. 1 are merely used as an example for illustration, but the present invention is not limited thereto. For example, when more power elements are included in the high-power medium-voltage drive or other power equipment, two or more power elements 401 may be disposed on the left surface of the heat dissipation substrate 20, and the other two or more power elements 403 are disposed on the right surface of the heat dissipation substrate 20. Those alternative embodiments shall also be regarded as falling within the spirit scope of the present invention.

In a specific embodiment, the heat pipe 10 is a heat pipe disposed vertically. Referring to FIG. 1, the condensation section 103 of the heat pipe disposed vertically is disposed above the evaporation section 101, and the evaporation section 101 is buried in the inner layer of the heat dissipation substrate 20. For example, the evaporation section of the heat pipe may be a rectangular pipe structure to enlarge the contact area between the heat pipe and the power elements and further to reduce the heat conductive resistance. When the power elements 401 and 403 are operated, the heat generated by power elements 401 and 403 is conducted to the heat pipe evaporation section. The liquid in the evaporation section 101 absorbs the heat, and is converted into vapor at slightly higher pressure. The vapor carrying the latent heat of vaporization travels upwards to the condensation section 103 along an inner cavity of the heat pipe 10. In the condensation section 103, the portion with the slightly lower temperature causes the vapor to release the latent heat of vaporization to the air from the heat sink fins via the heat pipe wall, and the vapor is condensed to liquid again. The condensed liquid flows back to the lower end (i.e. the evaporation section 101) from the upper end (i.e. the condensation section 103) of the heat pipe 10 along the wall of the heat pipe and/or an inner side of the capillary structure under gravity or a combination of gravity and capillary force, thereby starting the next evaporation/condensation loop. This continuous cycle transfers heat generated by power elements to air with lower temperature difference. In other embodiments, the heat pipe may be a gravity heat pipe without a capillary structure on the inner wall, or a screen heat pipe with a metal screen capillary structure inside, or a groove heat pipe with a groove capillary structure on the inner wall, or a sintered heat pipe with a metal powder sintered capillary structure on the inner wall. The capillary structure may not only provide the capillary force for pushing the working liquid to flow back, but also enhance the evaporation endothermic process and condensation exothermic process, thereby improving the heat transfer rate of the heat pipe, reducing the thermal resistance of the heat pipe, and improving the heat dissipation effect. Preferably, to reduce the cost of the heat sink, the groove copper-water heat pipe with a low cost may be adopted in this embodiment.

In a specific embodiment, the heat sink device further includes plural heat sink fins 30 disposed perpendicularly to the heat pipe 10 and securely connected to the condensation section 103 of the heat pipe 10, so as to rapidly dissipate the heat from the heat pipe to the air.

In another specific embodiment, the heat dissipation substrate 20 may be made of copper, aluminum or an aluminum alloy.

Figure 2:
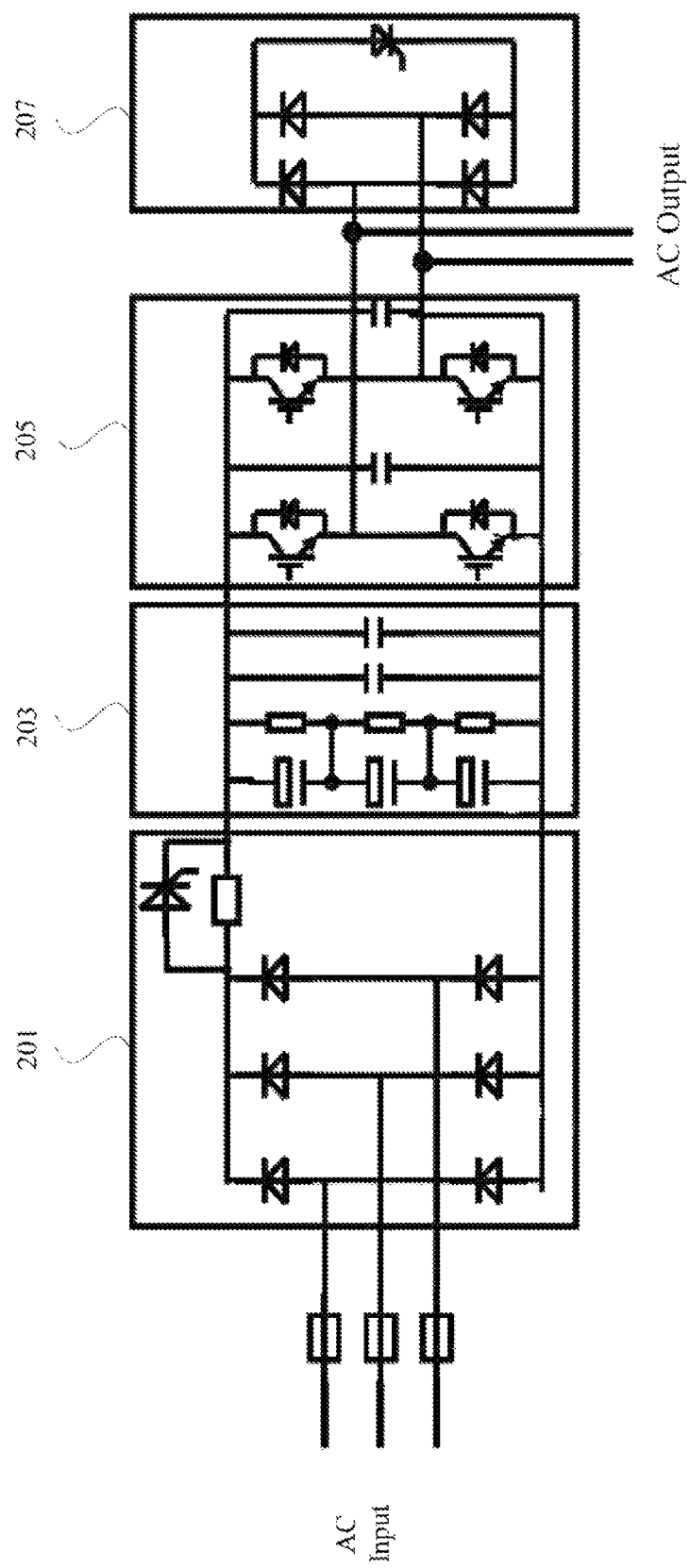
FIG. 2 is a schematic circuit diagram of the high-power medium-voltage drive power cell to which the heat sink device in FIG. 1 is applicable.

FIG. 2 is a schematic circuit diagram of the high-power medium-voltage drive power cell to which the heat sink device in FIG. 1 is applicable. Referring to FIG. 2, the high-power medium-voltage drive power cell includes a rectifier circuit 201, an electrolytic capacitor assembly 203, an inverter circuit 205 and a bypass circuit 207. The inverter circuit 205 is disposed on the first surface of the heat dissipation substrate 20, and the rectifier circuit 201 and the bypass circuit 207 are disposed on the second surface of the heat dissipation substrate 20. It can be understood easily that, since the inverter circuit 205 is operated with a high-frequency signal and the rectifier circuit 201 and the bypass circuit 207 are operated with a low-frequency signal, when the inverter circuit 205 and the rectifier circuit 201, the bypass circuit 207 are respectively disposed on two side surfaces of the heat dissipation substrate 20, the interference of the high-frequency signal to the low-frequency signal may be effectively prevented.

In the high-power medium-voltage drive power cell in FIG. 2, the rectifier circuit 201 rectifies a three-phase AC input voltage, so as to convert the AC input into a DC input. In addition, to provide current-limiting protection for the current in the main circuit, a fuse may be disposed between an AC input end of the drive and the rectifier circuit 201. When the current in the circuit is higher than a rated current of the fuse, the fuse provides shutoff protection for the circuit. The electrolytic capacitor assembly 203 is electrically connected to the rectifier circuit 201 for filtering the rectified DC voltage.

The inverter circuit 205, such as an IGBT inverter bridge, is electrically connected to the electrolytic capacitor assembly 203 for converting the DC voltage into the AC voltage with adjustable frequency and phase. In an embodiment, plural IGBTs may be connected in parallel to increase the current value of each IGBT in the IGBT inverter bridge. The bypass circuit 207 and the IGBT inverter bridge are connected for providing the bypass function when the IGBT inverter bridge works abnormally.

In an embodiment, the IGBT inverter bridge is an H-inverter bridge and includes plural bridge arms. Each bridge arm has plural IGBTs and the IGBTs in an upper arm and a lower arm of each bridge arm are connected in parallel. The IGBT inverter bridge includes a first bridge arm and a second bridge arm. The nodes at which the IGBTs are intersected in the first bridge arm are electrically connected to a first terminal of the AC output end of the drive, and the nodes at which the IGBTs are intersected in the second bridge arm are electrically connected to a second terminal of the AC output end of the drive.

In another embodiment, the rectifier circuit 201 is a rectifier bridge, and each bridge arm has at least one rectifier diode.

In still another embodiment, the bypass circuit 207 includes plural bridge arms and a switching branch connected in parallel to each of the plural bridge arms. Each bridge arm has plural diodes connected in series, connected in parallel or a combination of series and parallel, and the switching branch has a thyristor.

Those skilled in the art should understand that different power elements may generate different amounts of heat during normal operation. In order to reduce the cost of the heat pipe of the heat sink device and take the heat dissipation efficiency of the power elements into account, the heat sink device of the present invention may be altered and the altered heat dissipation structures may also fall within the spirit scope of the present invention.

In a specific embodiment, the condensation section 103 of the heat pipe is set to have different lengths according to heat generation and heat dissipation requirements of the power elements. For example, when the diodes in the rectifier circuit, the diodes in the bypass circuit, the thyristor and the IGBTs have low heat dissipation requirements, the length of the heat pipe condensation section 103 may be reduced to avoid wasting the heat pipe material. Also, for example, when the diodes in the rectifier circuit, the diodes in the bypass circuit, the thyristor and the IGBTs have high heat dissipation requirements, the length of the heat pipe condensation section 103 may be increased.

In another specific embodiment, the evaporation section 101 of the heat pipe is set to have different diameters according to heat dissipation requirements of the power elements. For example, when the diodes in the rectifier circuit, the diodes in the bypass circuit, the thyristor and the IGBTs have low heat dissipation requirements, the heat pipe with a small diameter may be adopted to avoid increasing the cost of the heat pipe caused by the heat pipe with a large diameter. Also, for example, when the diodes in the rectifier circuit, the diodes in the bypass circuit, the thyristor and the IGBTs have high heat dissipation requirements, the heat pipe with a large diameter may be adopted to meet the requirements for rapid heat dissipation of the power elements.

When the heat sink device of the present invention is applied, the evaporation section of the heat pipe is buried in the inner layer of the heat dissipation substrate, and a portion of the power elements and the other portion of the power elements of the high-power medium-voltage drive power cell are respectively disposed on two side surfaces of the heat dissipation substrate, thereby significantly reducing working temperatures of the power elements due to a superior thermal conductivity of the heat pipe. Moreover, the power elements of the drive power cell are disposed on two side surfaces of the heat dissipation substrate respectively, thereby effectively reducing the layout space of the power elements and further reducing the volume of the heat dissipation substrate.

Although the present invention has been disclosed with reference to the above embodiments, these embodiments are not intended to limit the present invention. It will be apparent to those skilled in the art that various modifications and variations can be made without departing from the scope or spirit of the present invention. Therefore, the scope of the present invention shall be defined by the appended claims.

What is claimed is:

1. A heat sink device, suitable for performing heat dissipation on a high-power medium-voltage drive power cell, the heat sink device comprising:
   a heat dissipation substrate having a first surface, a second surface and an inner layer between the first surface and the second surface; and
   a heat pipe having an evaporation section and a condensation section, wherein the evaporation section of the heat pipe is buried in the inner layer of the heat dissipation substrate, and the condensation section of the heat pipe is used to dissipate heat from the evaporation section to air,
   wherein one portion of power elements of the high-power medium-voltage drive power cell operated with a high-frequency signal are disposed on the first surface of the heat dissipation substrate, and another portion of the power elements of the high-power medium-voltage drive power cell with a low-frequency signal are disposed on the second surface of the heat dissipation substrate, the high-frequency signal is a signal that operates at a higher frequency then the low-frequency signal, such that the interference of the high-frequency signal to the low-frequency signal may be effectively prevented.

2. The heat sink device of claim 1, wherein the high-power medium-voltage drive power cell comprises an inverter circuit, a rectifier circuit and a bypass circuit, wherein the one portion of power elements of the high-power medium-voltage drive power cell operated with the high-frequency signal is the inverter circuit disposed on the first surface of the heat dissipation substrate, and the another portion of the power elements of the high-power medium-voltage drive power cell with the low-frequency signal is the rectifier circuit and the bypass circuit disposed on the second surface of the heat dissipation substrate.

3. The heat sink device of claim 2, wherein the inverter circuit is an H-inverter bridge comprising a plurality of bridge arms, and each of the bridge arms has a plurality of IGBTs (Insulated Gate Bipolar Transistors).

4. The heat sink device of claim 3, wherein the IGBTs in an upper arm and a lower arm of each of the bridge arms are connected in parallel.

5. The heat sink device of claim 2, wherein the rectifier circuit is a rectifier bridge and each of the bridge arms has at least one rectifier diode.

6. The heat sink device of claim 2, wherein the bypass circuit comprises a plurality of bridge arms and a switching branch connected in parallel to each of the bridge arms, and the each of the bridge arms has a plurality of diodes which are connected in series, connected in parallel or connected a combination of series and parallel, and the switching branch has a thyristor.

7. The heat sink device of claim 1, further comprising:
a plurality of heat sink fins disposed perpendicularly to the heat pipe and securely connected to the condensation section of the heat pipe, so as to dissipate the heat from the condensation section to the air.

8. The heat sink device of claim 1, wherein the heat dissipation substrate is made of copper, aluminum or aluminum alloy.

9. The heat sink device of claim 1, wherein the condensation section of the heat pipe is set to have different lengths according to heat generation and heat dissipation requirements of the power elements.

10. The heat sink device of claim 1, wherein the evaporation section of the heat pipe is set to have different diameters according to heat dissipation requirements of the power elements.

11. The heat sink device of claim 10, wherein the evaporation section of the heat pipe is a circular pipe structure or a rectangular pipe structure.

12. The heat sink device of claim 1, wherein the heat pipe is a gravity heat pipe, a groove heat pipe, a sintered heat pipe or a screen heat pipe.

* * * * *